(12) United States Patent
Yamamoto et al.

(10) Patent No.: US 7,449,706 B2
(45) Date of Patent: Nov. 11, 2008

(54) PHOTOCOUPLER WITH COMPENSATION CIRCUIT

(75) Inventors: Kenji Yamamoto, Kanagawa (JP); Hiroshi Ito, Nagano (JP)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 883 days.

(21) Appl. No.: 10/873,886

(22) Filed: Jun. 22, 2004

(65) Prior Publication Data

US 2005/0012687 A1    Jan. 20, 2005

(30) Foreign Application Priority Data

Jul. 15, 2003    (JP) .............................. 2003-197347

(51) Int. Cl.
*G02B 27/00*    (2006.01)
*H03L 5/00*    (2006.01)

(52) U.S. Cl. ...................................... 250/551; 327/333

(58) Field of Classification Search .......... 250/214 SW, 250/551; 398/162, 168, 191, 17; 327/104, 327/514, 333; 345/46
See application file for complete search history.

(56) References Cited

U.S. PATENT DOCUMENTS

| | | | | |
|---|---|---|---|---|
| 4,032,843 A | * | 6/1977 | Loucks | 324/96 |
| 4,292,551 A | * | 9/1981 | Kolmann | 327/514 |
| 4,420,841 A | | 12/1983 | Dudash | 455/607 |
| 4,636,655 A | * | 1/1987 | Nagano | 327/104 |
| 4,739,174 A | | 4/1988 | Nagano | 250/551 |
| 5,434,694 A | * | 7/1995 | Saito et al. | 398/191 |
| 5,995,252 A | * | 11/1999 | Nemer et al. | 250/551 |
| 6,355,936 B1 | | 3/2002 | Mastio | 250/551 |

FOREIGN PATENT DOCUMENTS

| | | |
|---|---|---|
| DE | 3442442 | 5/1986 |
| EP | 0 243 978 | 11/1987 |
| EP | 0 513 993 | 11/1992 |
| JP | 61-036981 | 2/1986 |
| JP | 62025468 | 2/1987 |
| JP | 1309407 | 12/1989 |
| WO | WO 97/02610 | 1/1997 |

OTHER PUBLICATIONS

Search Report dated Oct. 15, 2004 from GB0414365.7.

* cited by examiner

*Primary Examiner*—Georgia Y. Epps
*Assistant Examiner*—Jennifer Bennett

(57) ABSTRACT

A photocoupler having a first and second light-emitting diodes, a compensation circuit, which compensates input signals to the first light-emitting diode and generates input signals to the second light-emitting diode, and further makes the current waveform at the second light-emitting diode complementary to the current waveform at the first light-emitting diode, and at least one photodiode that detects the light emitted from the first and second light-emitting diodes.

16 Claims, 4 Drawing Sheets

PHOTOCOUPLER WITH COMPENSATION CIRCUIT

FIELD OF THE INVENTION

The present invention relates to an improved photocoupler alone, or a device that uses a photocoupler, comprising light-emitting diodes and photodiodes, and in particular, a photocoupler having a structure for compensating for non-linearity related to current-voltage properties of light-emitting diodes.

DISCUSSION OF THE BACKGROUND ART

Photocouplers have been used for insulation and separation of signals among input signals and output signals. In recent years there has been a demand for photocouplers that are useful for high-speed analog signal transmission while improving the insulation and separation characteristic. The nonlinearity of photocouplers, particularly the nonlinearity associated with the voltage-current properties of LEDs, becomes a problem in this case. That is, if the photocoupler has a strong nonlinearity, this will result in the distortion of signals during analog signal transmission.

A method of applying negative feedback has been proposed as an example of technology for avoiding this problem (See JP (Kohyo) 11[1999]-509367 and JP (Kokai) 61[1986]-36981). By means of this method, an additional photodiode is positioned close to the light-emitting diode. This photodiode has a structure with which the amount of light emitted from the light-emitting diode is monitored and this is fed back to the operating current of the light-emitting diode.

Nevertheless, in addition to the difficulty of accurate monitoring, it is extremely difficult to design a high-speed circuit with this structure because the amplifier for amplifying the signals requires a band that is at least 10 times the transmission signal bandwidth and nonlinear elements are used. Consequently, this structure cannot be used for high-speed communications.

A method has also been suggested whereby analog signals are not transmitted and instead, analog signals are converted to digital signals and then transmitted, after which they are converted back to analog signals. However, AD/DA converters or additional circuits for modulation-demodulation are necessary in this case, complicating the circuit structure, and high speed operation is still difficult.

Therefore, the present invention seeks to improve the non-linearity related to current-voltage properties of light-emitting diodes in photocouplers and provide a photocoupler with which relatively high-speed analog signal transmission is possible.

SUMMARY OF THE INVENTION

The present invention provides a photocoupler comprising two light-emitting diodes with almost common I-V properties, one of which is the principal light-emitting element and the other of which is a light-emitting element for compensation, in order to improve the nonlinearity of photocouplers, particularly the non-linearity associated with the properties of the light-emitting diodes. Compensation signals given to the light-emitting diode for compensation are determined from the operating input signals given to the principal light-emitting diode. These compensation signals are given as input of the light-emitting element for compensation. The light emitted from both of the light-emitting elements converges optically and is detected by a single photoelectric conversion detector (photodiode), or is detected by individual detectors, and this output is electrically combined. Transmission output signals with little distortion are obtained by superimposing these optical or electric signals.

A negative feedback means for the circuit is not necessary, and analog/digital conversion is not necessary, with the photocoupler of the present invention. Consequently, high-speed operation is possible with the photocoupler of the present invention. For instance, analog signals can be transmitted with little signal distortion at approximately 30 MHz or faster.

That is, the present invention provides a photocoupler which comprises first and second light-emitting diodes; a compensation circuit that compensates the input signals to this first light-emitting diode and produces input signals to this second light-emitting diode and makes the current waveform at this second light-emitting diode complementary to the current waveform at this first light-emitting diode; and at least one photodiode that detects the light emission of said first and second light-emitting diodes.

It is preferred that the compensation circuit determines that the input voltage waveform given to this second light-emitting diode becomes similar in shape but with a smaller output amplitude than the input voltage waveform to this first light-emitting diode.

It is preferred that the compensation circuit operates in such a way that the alternating-current component of this input voltage waveform is amplified by a pre-determined gain.

It is preferred that these first and second light-emitting diodes are grounded on one side.

It is preferred that this photodiode comprises separate first and second photodiodes corresponding to the first and second light-emitting diodes for receiving the light emitted from the respective light-emitting diode.

It is preferred that the photocoupler is structured such that signals that become the simple sum of detection signals are output by these first and second photodiodes.

It is preferred that a first group consisting of this first light-emitting diode and this first photodiode and a second group consisting of this second light-emitting diode and this second photodiode comprise separate integrated circuit (IC) packaged photocouplers.

It is preferred that these photodiodes become a single element that simultaneously receives the combined light emitted from these first and second light-emitting diodes.

It is preferred that this compensation circuit together with these light-emitting diodes and these photodiodes is included in a single IC package.

DETAILED DESCRIPTION OF THE PREFERRED EMBODIMENT

The present invention provides a photocoupler with improved nonlinearity related to the current-voltage properties of light-emitting diodes in a photocoupler and with which relatively high-speed signal transmission is possible.

Figure 1:
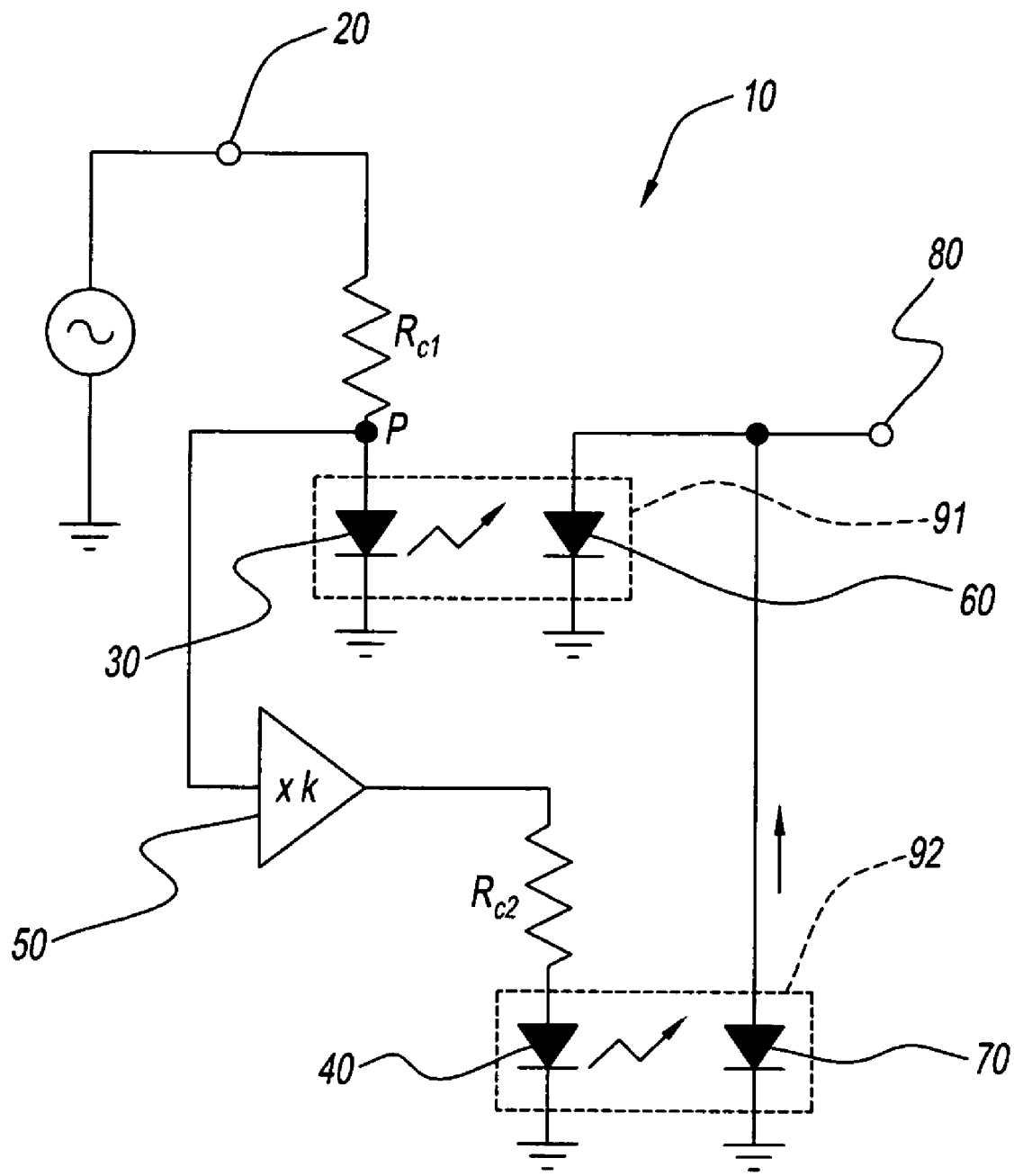
FIG. 1 is an electrical circuit that depicts the photocoupler according to the present invention.

Photocouplers according to the present invention will be described in detail while referring to the attached drawings. FIG. 1 is a diagram describing a first embodiment of the present invention.

As shown in FIG. 1, photocoupler 10 of the first embodiment comprises an input terminal 20, a first light-emitting diode (principal light-emitting element) 30, a second light-emitting diode (light-emitting element for compensation) 40, a compensation circuit 50 that gives compensation input signals to second light-emitting diode 40, a first photodiode 60 corresponding to first light-emitting diode 30, a second photodiode 70 corresponding to second light-emitting diode 40, and an output terminal 80.

Each element constituting photocoupler 10 is made by mounting several packaged ICs on a circuit board. First light-emitting diode 30 and first photodiode 60 as well as second light-emitting diode 40 and second photodiode 70 must be structured such that they individually transmit and receive light signals and therefore, these groups are usually made into individual photocoupler ICs (refer to reference numbers 91 and 92). In this case, the compensation circuit is outside these ICs, but it can also be contained in one of these ICs. Furthermore, photocoupler 10 is an element providing electrical insulation and separation, and the side of light-emitting diodes 30 and 40 as well as the side of photodiodes diodes 60 and 70, where light emitted from light-emitting diodes 30 and 40 is received, are separate boards.

Furthermore, although each group comprised of first light-emitting diode 30 and first photodiode 60 and comprised of second light-emitting diode 40 and second photodiode 70 can be contained in exactly the same package, independent signal transmission is necessary, and therefore, a barrier structure for optical separation is needed between the two groups, making production difficult. In this case, the compensation circuit can also be on a third board in the same package.

Input terminal 20 is a terminal that receives the high-frequency signals used for communications. The light signals received by input terminal 20 are guided through resistor $R_{c1}$ to first light-emitting diode 30. Pre-determined light emission is produced at first light-emitting diode 30 by the current that is flowing in accordance with the signal voltage waveform of the input signals. The current-voltage properties at first light-emitting diode 30 are usually nonlinear and therefore, light emission intensity to signal intensity is nonlinear and the output of the photodiodes that directly receive this light produce a signal distortion. The photocoupler 10 advantageously includes some elements for preventing this signal distortion, e.g. second light emitting diode 40. Their effect is described below.

The input signals to second light-emitting diode 40 for signal compensation are given by compensation circuit 50. Voltage signals for compensation are produced by reference to the waveform of signals input to first light-emitting diode 30 (point P). That is, second light-emitting diode 40 receives the signals generated by the compensation circuit for signal waveform compensation and emits light in accordance with these signals.

By means of the present embodiment, compensation circuit 50 multiplies the voltage waveform at point P in FIG. 1 k times to form signals of a similar voltage waveform and these serve as the compensation signals. The compensation signals are given to second light-emitting diode 40 through resistance $R_{c2}$.

Figure 2:
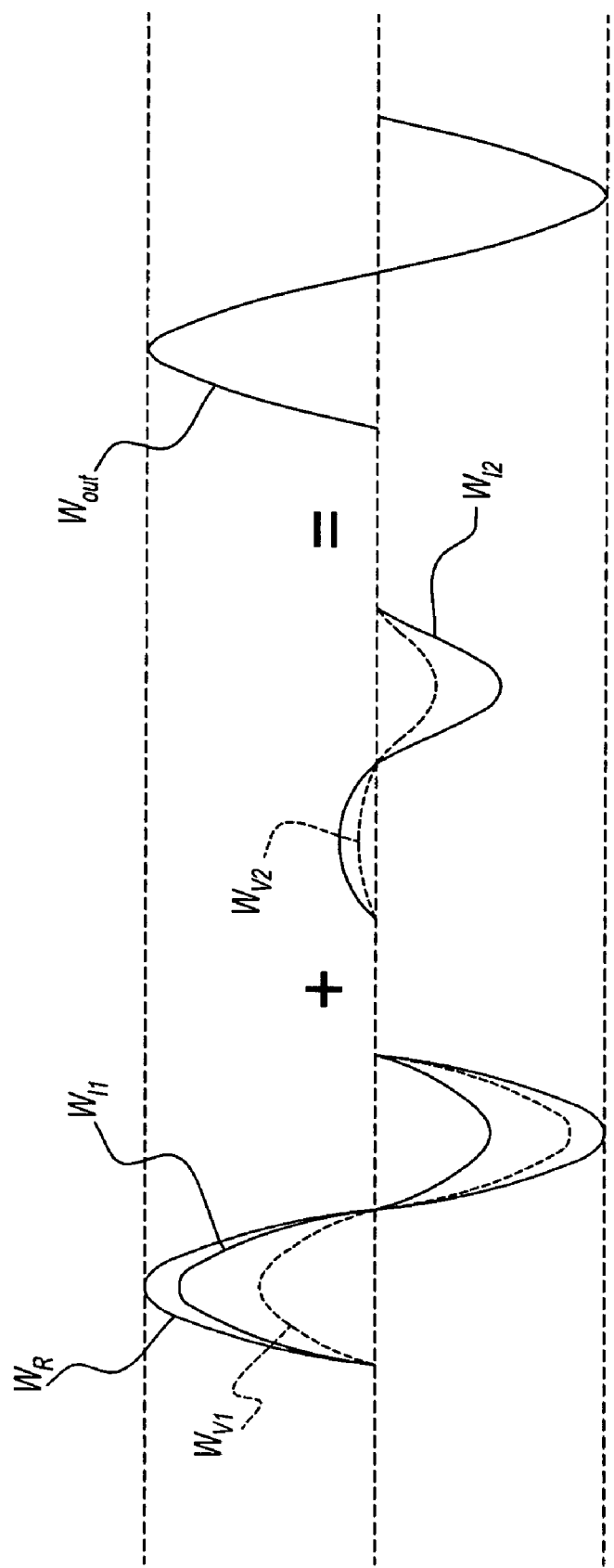
FIG. 2 is a theoretical graph depicting the signal waveforms according to the present invention.

Each signal waveform is shown in FIG. 2. The broken line ($W_{V1}$) in the figure is the voltage waveform at point P in FIG. 1. The voltage waveform of the signal has already been distorted at the step before its input to first light-emitting diode 30 and its amplitude is relatively small on the positive side, while its amplitude is larger on the negative side when compared to the distortion-free sine waveform (dashed line: $W_R$). This voltage waveform is distorted due to the fact that point P is at the input position of the positive terminal of the light-emitting diode that has been grounded at the negative terminal side.

On the other hand, the waveform of the current that flows through first light-emitting diode 30 at this time is shown by the solid line ($W_{I1}$). The light emission intensity at a light-emitting diode is generally considered to be almost proportional to the current within a normal range and therefore, this current waveform is apparently almost the same as the detected values at first photodiode 60. As is clear from this figure, the current waveform, that is, the waveform of the detection signals at first photodiode 60, has a relatively large amplitude on the positive side and a relatively small amplitude on the negative side.

As was previously explained, compensation circuit 50 gives the signal waveform for compensation of a shape similar to the voltage signal waveform at point P. When compensation signals are input to second light-emitting diode 40, the waveform of the input voltage signals to second light-emitting diode 40 further deforms just as the distortion that is produced in the voltage waveform at point P and the signal amplitude of the compensation signal waveform becomes even smaller on the positive side when compared to the negative side, as shown by the dashed line ($W_{V2}$). The waveform of the current that flows to second light-emitting diode 40 at this time ($W_{I2}$) becomes smaller in amplitude on the positive side and larger in amplitude on the negative side, as shown by the solid line. As with first light-emitting diode 30, this current waveform is approximately the same as the output waveform of second photodiode 70.

What should be noted is that alternating current signals that are virtually distortion free ($W_{out}$) can be reproduced from the sum of the waveform of first light-emitting diode 30 and the current waveform of second light-emitting diode 40, that is, the sum of the output waveform of first photodiode 60 and the output waveform of second photodiode 70, but optimizing the value of above-mentioned "k." That is, the distortion of signals can be compensated by using first and second light-emitting diodes 30 and 40 and the corresponding first and second photodiodes 60 and 70.

If phase distortion of the current waveform signals is large, distortion compensation may not be sufficient when compensated by the sum of the current waveforms of first light-emitting diode 30 and second light-emitting diode 40. A structure may be used here for combining the phase of two signals when the sum of current waveforms is used in order to efficiently reduce the distortion. An example of a specific means is the method whereby a buffer with the same delay as compensation circuit 50 is introduced behind photodiode 60 in order to improve the symmetry of the circuit structure. Furthermore, results that are satisfactory for practical application can be obtained by speeding up compensation circuit 50.

Figure 3:
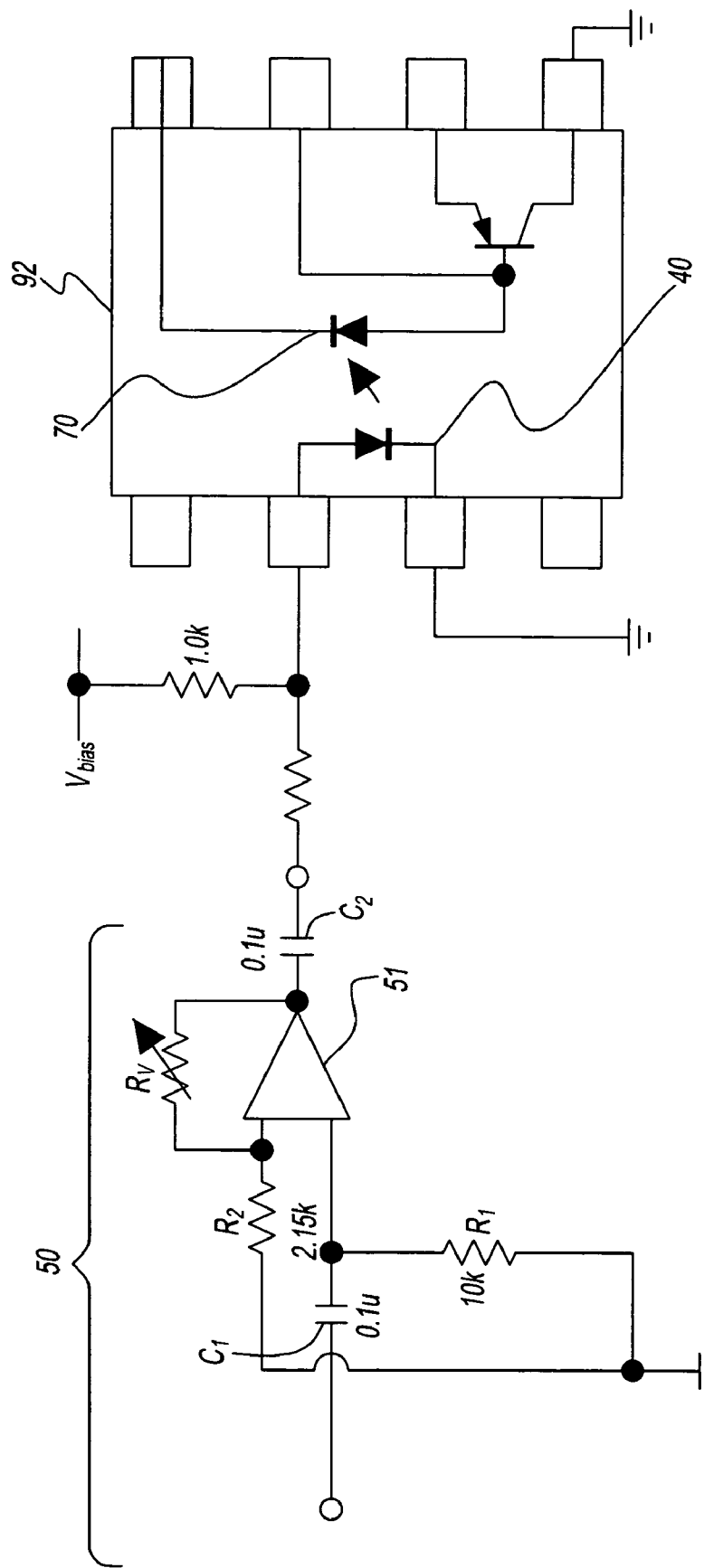
FIG. 3 is the compensation circuit according to the present invention.

FIG. 3 is a circuit diagram showing an example of the compensation circuit. The compensation circuit is shown together with the photocoupler that is used with the circuit. Compensation circuit 50 includes differential amplifier 51. The voltage signals that branch at the input side of first light-emitting diode 30 are input to the positive terminal of differential amplifier 51 through capacitor $C_1$. As shown in the figure, this positive terminal is grounded via resistor $R_1$ (10 k$\Omega$) and the negative terminal is grounded via resistor $R_2$ with a smaller resistance (2.15 k$\Omega$). Furthermore, although the negative terminal is connected to the output side via variable resistance $R_P$, the resistor can also have a resistance that has been set at an optimal value.

As shown in the figure, the output of compensation circuit 50 is connected to a bias terminal via capacitor $C_2$ and is input to the LED terminal of photocoupler 92. As a result, alternating-current signals that have been amplified to a pre-determined intensity by the compensation circuit are input to the photocoupler.

The output waveforms of first photodiode 60 and second photodiode 70 are electrically combined and output as sum signals in the embodiment in FIG. 1. As a result, alternating-current signals that have been input to input terminal 20 are transmitted up to output terminal 80 as they are being brought to minimal distortion by being electrically insulated. Furthermore, signal treatment, such as the necessary amplification and so forth, is performed on the detection signals of first and second photodiodes 60 and 70, or the sum signal of these detection signals, but a conventional amplification method can be used, and therefore, a description for this is not given.

Figure 4:
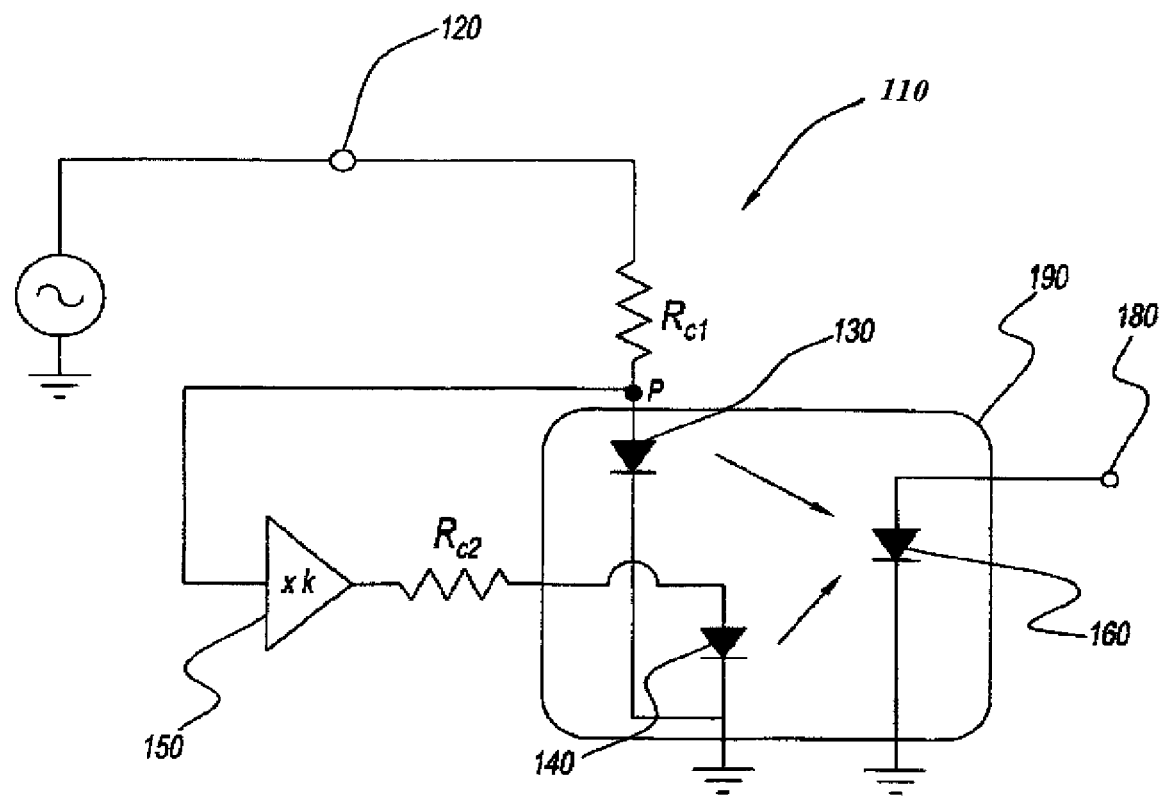
FIG. 4 is an electrical circuit that depicts the photocoupler according to another embodiment of the present invention.

FIG. 4 is a diagram showing a photocoupler that is a second preferred embodiment of the present invention. This photocoupler 110 comprises input terminal 120, first and second light-emitting diodes 130 and 140, compensation circuit 150, photodiode 160, and output terminal 180. Photocoupler 110 is usually made into an individually packaged IC 190 as in the first embodiment, but it can also be made into an IC package that contains compensation circuit 150.

The difference from the first embodiment is that a single photodiode 160 receives light from first and second light-emitting diodes 130 and 140. That is, as with the first embodiment, input signals are given from input terminal 120 to first light-emitting diode 130, and signals that are obtained when the signal voltage at the input side of the first light-emitting diode 130 is compensated by compensating circuit 150 are given to second light-emitting diode 140. The light that has been emitted by light-emitting diodes 130 and 140 in accordance with these signals is received by a single photodiode 160.

Consequently, in contrast to the fact that by means of the first embodiment, signals from first and second photodiodes 60 and 70 are electrically synthesized and output as a sum signal, by means of the second embodiment, they are synthesized as the sum of the amount of light (the sum of the number of photons) when light is received at photocoupler 160 and electric signals corresponding to this sum are output at photodiode 160. That is, taking FIG. 2 into consideration once again, the signal waveform at the input side of first light-emitting diode 130, that is, at point P, and the signal waveform at the input side of second photodiode 140 are optically synthesized. In other words, the sum waveform shown to the right in the figure is the same as the amount of light received by the single photodiode 160 and is understood to be the output from this photodiode 160.

An advantage of the second embodiment is that the number of elements that are used can be minimized and as a result, the device can have a simpler structure. In particular, in addition to there being only one photodiode, additional circuits for amplification and synthesis of electrical signals in later steps are not necessary and therefore, there is a practical advantage in this case.

Preferred embodiments of the present invention were described above, but these are only examples and a variety of alterations and modifications by persons skilled in the art are possible. For instance, the number of light-emitting diodes in the present embodiments was two, but it is possible to add more light-emitting diodes. In this case, it is also possible to add photodiodes in combination with these light-emitting diodes, or it is possible for one photodiode to receive the light of three or more light-emitting diodes.

What is claimed is:

1. A photocoupler, comprising:
   an input terminal;
   an output terminal;
   a first resistor with one end of the first resistor coupled to the input terminal;
   a first light emitting diode (LED) coupled to an opposing end of the first resistor thereby forming a first junction, the first LED configured to emit light upon receiving a first signal that is present at the first junction as a result of an input signal being applied to the input terminal and propagated through the first resistor;
   a first photodiode coupled to the output terminal of the photocoupler, the first photodiode configured to receive light emitted by the first LED and generate therefrom, a first portion of an output signal that is propagated to the output terminal;
   a signal compensation circuit comprising an alternating current (AC) amplifier coupled to the first junction, the AC amplifier configured to receive the first signal present at the first junction and generate therefrom, a compensation signal;
   a second resistor with a proximal end coupled to an output capacitor of the AC amplifier;
   a third resistor with one end coupled to a biasing voltage and an opposing end coupled to a distal end of the second resistor thereby forming a second junction at the distal end of the second resistor;
   a second LED coupled to the second junction, the second LED configured to emit light upon receiving the compensation signal from the second junction; and
   a second photodiode coupled to the output terminal of the photocoupler, the second photodiode configured to receive light emitted by the second LED and generate therefrom, a second portion of the output signal that is provided to the output terminal, the second portion operative to compensate for a current-voltage non-linearity present in the first portion of the output signal.

2. The photocoupler of claim 1, wherein a first LED current flowing through the first LED as a result of the first signal, has a distortion whereby there is a smaller current amplitude on a negative side of a horizontal axis than on a positive side of the horizontal axis.

3. The photocoupler of claim 2, wherein a second LED current flowing through the second LED as a result of the compensation signal, has a smaller current amplitude on the positive side of the horizontal axis than on the negative side of the horizontal axis thereby compensating for the distortion in the first LED current flowing through the first LED.

4. The photocoupler of claim 2, wherein the first signal that is present at the first junction has a smaller voltage amplitude on the positive side of the horizontal axis than on the negative side of the horizontal axis.

5. The photocoupler of claim 1, wherein the first LED is the same as the second LED whereby a summing of the first and second portions of the output signal is carried out in an optical domain.

6. The photocoupler of claim 1, wherein the first and second photodiodes are housed together with the first and second LEDs in a common integrated circuit (IC) package.

7. The photocoupler of claim 6, the first and second LEDs are configured to provide a summing of the first and second portions of the output signal in an electrical domain.

8. The photocoupler of claim 6, wherein the first LED is the same as the second LED whereby a summing of the first and second portions of the output signal is carried out in an optical domain.

9. The photocoupler of claim 1, wherein the input signal is an analog signal.

10. The photocoupler of claim 1, further comprising a buffer coupled to the second photodiode, the buffer configured to provide a first phase delay that is selected to compensate for a phase distortion in the output signal.

11. The photocoupler of claim 10, wherein the first phase delay is selected to correspond to a second phase delay introduced by the compensation circuit.

12. A method of operating a photocoupler, the method comprising:
   propagating through a first resistor and into a first light emitting diode (LED), an analog alternating current (AC) input signal;
   propagating a portion of the AC input signal into a compensation circuit comprising an AC amplifier, wherein the portion of the AC input signal is coupled out from a junction of the first resistor and the first LED;
   providing a second resistor with a proximal end coupled to an output capacitor of the AC amplifier;
   providing a third resistor with one end coupled to a biasing voltage and an opposing end coupled to a distal end of the second resistor thereby forming a second junction at the distal end of the second resistor;
   propagating from the second junction and into a second LED, a compensation signal generated by the compensation circuit;
   optically coupling the first LED to a first photodiode, whereby the first photodiode generates a first portion of an output signal of the photocoupler;
   optically coupling the second LED to a second photodiode, whereby the second photodiode generates a second portion of the output signal; and
   summing the first and second portions of the output signal wherein the second portion is operative to compensate for a current-voltage non-linearity present in the first portion of the output signal.

13. The method of claim 12, wherein the first and second LEDs are configured to provide the summing of the first and second portions of the output signal in an electrical domain.

14. The method of claim 12, wherein the first LED is the same as the second LED whereby the summing of the first and second portions of the output signal is carried out in an optical domain.

15. The method of claim 12, further comprising:
   providing a phase delay to the first portion of the output signal to compensate for a phase distortion in the summed output signal.

16. The method of claim 15, wherein the phase delay is selected in accordance with a propagation characteristic of the compensation circuit.

* * * * *